(12) United States Patent
Devine et al.

(10) Patent No.: US 6,452,770 B1
(45) Date of Patent: Sep. 17, 2002

(54) POWER BUSS INHIBIT THROUGH DATA INPUT/OUTPUT LINES

(75) Inventors: James M. Devine, Blairstown; Daniel M. Kuster, Annandale; Peter J. Massa, Leonia, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 44 days.

(21) Appl. No.: 09/584,195

(22) Filed: May 31, 2000

(51) Int. Cl.[7] ................................................. H02H 3/20
(52) U.S. Cl. ........................ 361/91.5; 327/525; 327/565
(58) Field of Search ........................... 361/88, 90, 91.1, 361/91.5, 91.6, 100, 104, 103, 115, 56; 327/525, 530, 564, 565, 545, 546, 551, 594; 365/225.7, 189.05, 226, 228

(56) References Cited

U.S. PATENT DOCUMENTS

| | | | |
|---|---|---|---|
| 4,871,927 A | * 10/1989 | Dallavalle | 327/537 |
| 5,568,060 A | * 10/1996 | Bartholomay et al. | 326/86 |
| 5,585,792 A | * 12/1996 | Liu et al. | 341/22 |
| 5,708,771 A | * 1/1998 | Brant et al. | 395/182.2 |
| 6,266,290 B1 | * 7/2001 | Sredanovic et al. | 365/225.7 |

* cited by examiner

*Primary Examiner*—Ronald W. Leja
(74) *Attorney, Agent, or Firm*—Charles I Brodsky, Esq.

(57) ABSTRACT

In a CMOS integrated circuit card configuration operating upon a received data input stream and having a common power buss for the individual integrated circuits thereof, the invention comprises the connection of a power pin of all such individual integrated circuits directly to the power buss, except for the integrated circuit to which the data input stream is applied, wherein a diode of predetermined forward voltage drop is employed—having its anode connected to the power buss and its cathode connected to its associated power pin.

12 Claims, 1 Drawing Sheet

POWER BUSS INHIBIT THROUGH DATA INPUT/OUTPUT LINES

BACKGROUND OF THE INVENTION

1. Field of the Invention

This invention relates to high speed digital data processing arrangements and, more particularly, to CMOS integrated circuit card configurations operating upon a received data input stream.

2. Description of the Related Art

High speed, digital data processing arrangements employing CMOS devices typically operate with supply voltages of 5 volts. When used in system configurations, input/output data busses conventionally run between individual integrated circuit cards. When a system fails, investigation is needed to locate the defective integrated circuit card, and to replace it. Where, instead, the integrated circuit card continues to operate—albeit outside the range for which it was designed—, other circuit cards frequently become loaded, and the circuits become unable to communicate intelligently with one another. System operation can then be down for hours, or even days, until the problem is cleared.

Analysis has shown that haphazard operation can occur when the power buss fuse blows on an individual integrated circuit card while the card continues to receive incoming data. Such analysis revealed that this was due to the intrinsic substrate diode incorporated in the CMOS manufacture as a safety precaution. There, with the intrinsic diode at each integrated circuit input, when the power buss was open, the decoupling capacitors charged through the data lines, and to a voltage which depended upon the number of integrated circuits connected to the power buss and upon the frequency of the data pulse transmissions. Thus, even where no supply voltage was being provided (as the fuse was open-circuited), the decoupling capacitors charged to some intermediate voltage, but less than the 5 volts or so specified by the integrated circuit manufacturer for guaranteed circuit operation to follow. A degree of integrated circuit operation resulted, but one which was indeterminate, indefinite and non-predictable.

SUMMARY OF THE INVENTION

As will become clear from the following description, correct charging of the decoupling capacitor essentially is attained by with the invention disconnecting from the power buss that power pin of the integrated circuit to which the data input stream is applied, while continuing to directly connect the power buss to the power pin of the remaining individual integrated circuits on the CMOS card. In accordance with the invention, and as will be seen, at that input stage, a diode is connected instead, with its anode connected to the power buss and with its cathode connected to the power pin. In a preferred embodiment of the invention, the diode is in the form of a Schottky diode with its anode at the power buss and its cathode at the power pin, selected to exhibit a forward voltage drop of the order of 0.3 volts for a 5 volt or so power buss voltage. Depending upon the supply voltage to which the CMOS integrated circuits are designed, the forward voltage drop of the diode selected may be greater or less, chosen to couple that voltage from the power buss sufficient to operate the integrated circuit transistors at their manufacturer recommended ranges of performance.

As will be seen, a pair of arrangements for the Schottky diode inclusion are described—one, operable with a CMOS integrated circuit card of the type typically manufactured, with the power pins of the individual integrated circuits all directly connected to the common power buss. Utilizing the teachings of the invention in this arrangement, a circuit designer simply removes the trace connection on the circuit card for that stage (or stages) receiving the input data, and externally connecting instead the Schottky diode from the decoupling capacitor to the power pin of the stage (or stages).

In the second arrangement, on the other hand, the typical CMOS integrated circuit manufacture is modified to include the Schottky diode directly on the monolithic device, included between the common power buss and the power pin for each individual integrated circuit, and paralleling the diode with a switch, to be either short circuited where the individual stage is not receiving the data input stream, or to be open circuited (and, therefore, inserting the Schottky diode) where the stage is to be so used. In this arrangement, as described below, the switch is in the form of a fuseable link, to be burned open by the circuit designer at those locations where the input data stream is not being operated upon.

Thus, in these manners, the teachings of the invention can be incorporated by the integrated circuit manufacturer in redesigning the integrated circuit device; or by the circuit designer in removing the trace between the power pin and power buss on the card, and adding instead, the Schottky diode or other reverse-bias diode of the invention to prevent the data pulses from charging the decoupling capacitor(s).

BRIEF DESCRIPTION OF THE DRAWINGS

These and other features of the present invention will be more clearly understood from a consideration of the following description, taken in connection with the accompanying drawings in which.

DETAILED DESCRIPTION OF THE INVENTION

Figure 1:
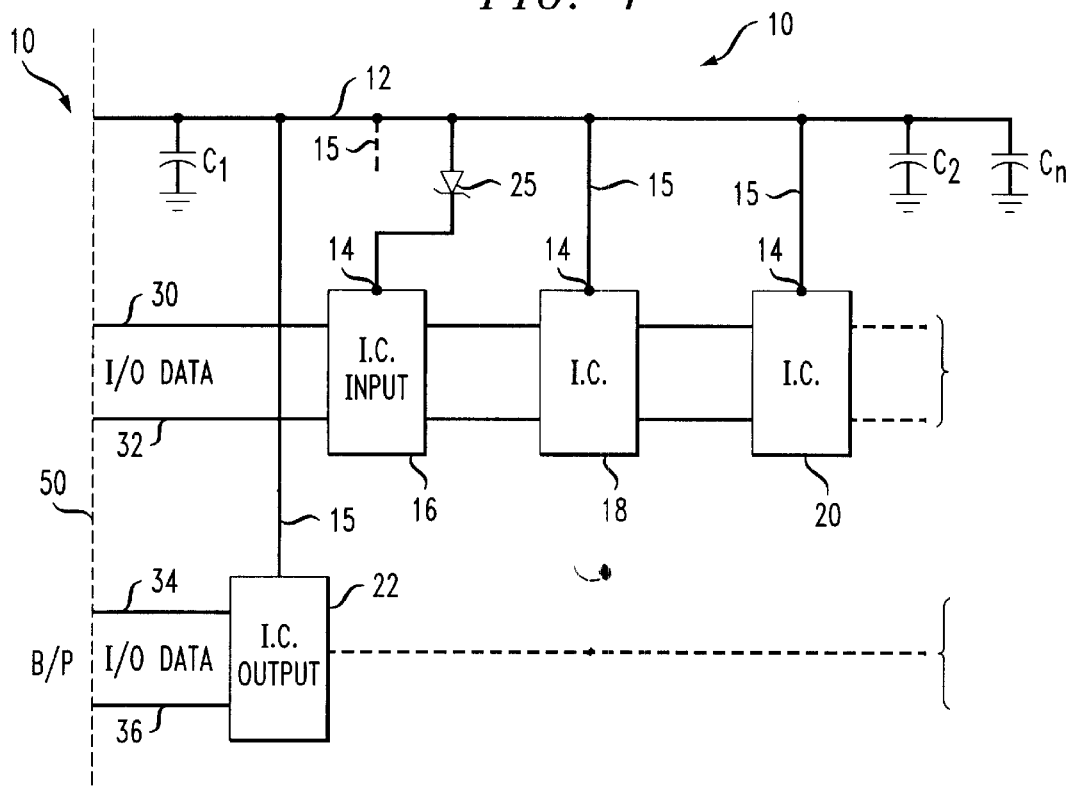
FIG. 1 is a block diagram illustrating the isolation of the data buss from the power buss on a conventionally manufactured integrated circuit card, according to the present invention.

The block diagram of FIG. 1 illustrates a conventionally manufactured integrated circuit card 10, in which its power buss 12 is directly connected to the power pin 14 of the integrated circuit input stage 16, of each intermediate integrated circuit stage 18, 20, etc. and of the output stage 22. Such trace connections on the card are illustrated at 15. Various decoupling capacitors $C_1, C_2 \ldots C_n$ are shown between the power buss 12 and ground, as needed. Input/output (I/O) data lines couple to the input integrated circuit stage 16 from the back panel 50 of the integrated circuit card (as at 30, 32) while input/output (I/O) data information is coupled from the integrated circuit output stage 22 as at 34, 36.

Analysis has revealed that the intrinsic diode inherent in the CMOS integrated circuit device (16, 18, 20, 22, etc.) with its anode at the I/O data lines 30, 32 and with its cathode at the power pin of such stage serves to charge the decoupling capacitors through the data stream when the fuse on the integrated circuit card blows and power is lost along the power buss. Under this circumstance—or similarly where the circuit card is only partially powered to a lesser supply voltage—, the data line charges the decoupling capacitors to a voltage less than the proper operating voltage specified for the circuit components, causing the circuit card to operate in an indeterminate, haphazard manner.

In accordance with the invention, however, a circuit designer is able to prevent this from occurring, simply by removing the trace connection between the power pin 14 and the power buss 12 on the input integrated circuit stage 16, and externally adding in its place a diode having its anode connected to the power buss 12 and its cathode connected to the power pin 14, and one which exhibits a forward voltage drop to cooperate with the supply voltage that is otherwise present at the power buss to provide the voltage needed to operate the integrated circuit components at the performance range specified by the integrated circuit device manufacturer. Such diode, reverse-biased when the power buss voltage is lost, prevents the power decoupling capacitors from charging through the data lines and negates the coupling of lesser voltages to the remaining integrated circuits 18, 20, etc. to operate them in an ambiguous manner.

Where the power buss typically provides a 5 volt supply to operate the integrated circuit cards, such diode may take the form of a Schottky diode 25, exhibiting a forward voltage drop of 0.3 volts. By removing the trace connection from the power pin 14 of the integrated circuit input stage 16 to the power buss 12, and by inserting instead the Schottky (or similar) diode 25 with its anode at the power buss 12 and its cathode at the power pin 14, a circuit designer can then modify the conventional integrated circuit card to isolate the unpowered power buss 12 from the data lines 30, 32. The ambiguous, indeterminate, and haphazard operation can thus be avoided.

Figure 2:
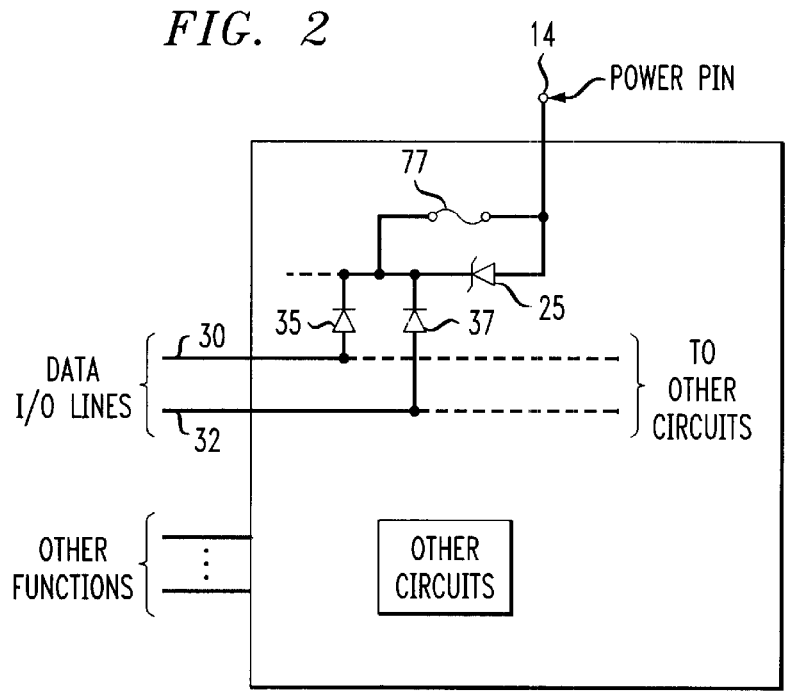
FIG. 2 is a block diagram depicting a modified integrated circuit device and its internal connection of a fuseable link for carrying out the teachings of the invention.

Whereas the isolation of the data lines from the power buss in the manner of FIG. 1 is particularly attractive where the integrated circuit card manufacturer continues to provide its integrated circuit devices without modification, the block diagram of FIG. 2 illustrates a solution to the problem where the integrated circuit device manufacturer is willing to modify the integrated circuit. In FIG. 2, the I/O data lines 30, 32 are shown with the inherent, intrinsic CMOS protective diodes 35, 37 and with the Schottky diode 25 incorporated as part of an original integrated circuit device, with the anode and cathode connections as set forth above. With the power pin 14 directly connected to the power buss 12, a fuseable link 77 is incorporated as a switch in parallel with the Schottky diode in each stage—to be open circuited where the Schottky diode is to be inserted into the circuit (as at an input stage), or to be short-circuited and thereby removing the diode from the configuration where the diode is not required (as in the non-input stages). The circuit designer could then selectively burn-open each fuseable link associated with that stage serving as an input for the data stream being received. As with the block diagram arrangement of FIG. 1, in FIG. 2, the circuit designer opens the fuseable link in manner comparable to removing the trace connection in FIG. 1. However, in FIG. 2, the designer is saved the necessity of having to add the Schottky diode to the CMOS integrated circuit card configuration as an external connection. As with the arrangement of FIG. 1, the diode to be added is selected to exhibit a forward voltage drop when power is applied to the board, sufficient to bring the integrated circuit transistors and other components to the voltage level at which the circuit board manufacturer recommends for the correct range of performance to follow.

While there have been described what are considered to be preferred embodiments of the present invention, it will be readily appreciated by those skilled in the art that modifications can be made without departing from the scope of the teachings herein—not the least of which is that diodes other than Schottky diodes could be employed in a comparable reverse-biased manner, and of characteristics to exhibit other than the illustrative 0.3 volt forward voltage drop called out. For at least such reason, therefore, resort should be had to the claims appended hereto for a true understanding of the scope of the invention.

We claim:
1. The combination comprising:
   a CMOS integrated circuit card configuration including a plurality of integrated circuits operating upon a received data input stream, with said card configuration having a common power buss for the individual integrated circuits of said plurality;
   a plurality of short circuit connections between each power pin included on all individual integrated circuits of said card configuration and said power buss, except for one integrated circuit to which said data input stream is applied; and
   a diode coupling the power pin of said one integrated circuit to said power buss, with the anode of said diode connected to said power buss and with the cathode of said diode being connected to said power pin of said one integrated circuit.

2. The combination of claim 1, wherein said diode exhibits a forward voltage drop to couple a voltage from said power buss to said one integrated circuit sufficient to operate transistors therein at their manufacturer recommended range of performance.

3. The combination of claim 2, wherein said diode is a Schottky diode having an anode connected to said power buss and a cathode connected to said power pin of said one integrated circuit.

4. The combination of claim 3, wherein all power pins of all individual integrated circuits are initially connected by short circuit connections to said power buss, wherein at least one decoupling capacitor is coupled to said power buss, and wherein the short circuit connection between the power pin and the power buss of said one integrated circuit receiving said data input stream is thereafter broken, with said Schottky diode being added in place of said broken connection with the anode connected to said one decoupling capacitor.

5. The combination of claim 2, wherein said CMOS integrated circuit card configuration contains said plurality of individual integrated circuits thereon, each of said integrated circuits including a diode having an anode connected to said power buss and a cathode connected to each individual integrated circuit, and each individual integrated circuit including a switch coupled across the diode thereof for the short circuit connection, said one integrated circuit having its switch open circuited thereby receiving the input data.

6. The combination of claim 5, wherein each such switch includes a fuseable link burnable to an open circuit condition.

7. The combination of claim 3, wherein said Schottky diode exhibits a forward voltage drop of the order of 0.3 volts.

8. The combination of claim 3, wherein said power buss supplies a voltage of the order of 5 volts and wherein said Schottky diode exhibits a forward voltage drop of the order of 0.3 volts.

9. A CMOS integrated circuit card configuration having a common power buss and operating upon a received data input stream comprising:
   a plurality of individual integrated circuits on said card configuration, to one of which said data input stream is applied; and a direct connection from each power pin of all but one of such individual integrated circuits directly to said power buss;

said one individual integrated circuit being said integrated circuit to which said received data input stream is applied; and a diode having an anode connected to said power buss and a cathode connected to the power pin associated with said one individual integrated circuit.

10. The CMOS integrated circuit card configuration of claim 9 wherein said diode exhibits a forward voltage drop to couple a voltage from said power buss to said individual integrated circuit sufficient to operate transistors therein at their manufacturer recommended range of performance.

11. The CMOS integrated circuit card configuration of claim 10 wherein said diode is a Schottky diode exhibiting a forward voltage drop of the order of 0.3 volts.

12. The CMOS integrated circuit card configuration of claim 9 wherein said power buss supplies a voltage of the order of 5 volts and wherein said diode is a Schottky diode exhibiting a forward voltage drop of the order of 0.3 volts.

* * * * *